United States Patent
Kita

(10) Patent No.: US 6,699,638 B2
(45) Date of Patent: Mar. 2, 2004

(54) NEGATIVE-WORKING HEAT-SENSITIVE LITHOGRAPHIC PRINTING PLATE PRECURSOR

(75) Inventor: Nobuyuki Kita, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 203 days.

(21) Appl. No.: 09/742,342

(22) Filed: Dec. 22, 2000

(65) Prior Publication Data

US 2001/0031423 A1 Oct. 18, 2001

(30) Foreign Application Priority Data

Dec. 27, 1999 (JP) .................................. P.11-371047

(51) Int. Cl.$^7$ .............................................. G03F 7/004
(52) U.S. Cl. .............................. 430/273.1; 430/270.1; 430/300; 430/302; 430/944; 430/945; 101/453; 101/457; 101/467
(58) Field of Search ................. 430/270.1, 273.1, 430/300, 302, 944, 945; 101/453, 457, 467

(56) References Cited

U.S. PATENT DOCUMENTS

| | | | | | |
|---|---|---|---|---|---|
| 5,340,699 A | * | 8/1994 | Haley et al. | ................. | 430/302 |
| 5,372,907 A | * | 12/1994 | Haley et al. | ................. | 430/157 |
| 5,466,557 A | * | 11/1995 | Haley et al. | ................. | 430/278 |
| 5,725,994 A | * | 3/1998 | Kondo | ................... | 430/270.1 |
| 5,807,658 A | * | 9/1998 | Ellis et al. | ................... | 430/302 |
| 5,908,731 A | * | 6/1999 | Leenders et al. | ......... | 430/273.1 |
| 5,972,556 A | * | 10/1999 | Leenders | .................... | 430/200 |
| 5,985,514 A | * | 11/1999 | Zheng et al. | ............ | 430/270.1 |
| 6,068,963 A | * | 5/2000 | Aoshima | ................ | 430/270.1 |
| 6,077,641 A | * | 6/2000 | Parsons et al. | ............. | 430/157 |
| 6,090,524 A | * | 7/2000 | Deboer et al. | ............ | 430/272.1 |
| 6,096,479 A | * | 8/2000 | Kawamura et al. | ...... | 430/270.1 |
| 6,153,352 A | * | 11/2000 | Oohashi et al. | .......... | 430/270.1 |
| 6,159,657 A | * | 12/2000 | Fleming et al. | .......... | 430/270.1 |
| 6,214,515 B1 | * | 4/2001 | Van Damme et al. | ...... | 430/188 |
| 6,228,559 B1 | * | 5/2001 | Oda | ....................... | 430/272.1 |
| 6,245,477 B1 | * | 6/2001 | Ray et al. | ................... | 430/138 |
| 6,248,503 B1 | * | 6/2001 | Vermeersch et al. | ........ | 430/302 |
| 6,303,267 B1 | * | 10/2001 | Benzing et al. | .......... | 430/270.1 |
| 6,397,749 B1 | * | 6/2002 | Kita et al. | ................... | 101/457 |
| 6,416,939 B1 | * | 7/2002 | Shimada et al. | ............ | 430/325 |
| 6,447,978 B1 | * | 9/2002 | Leon et al. | .............. | 430/270.1 |
| 6,451,500 B1 | * | 9/2002 | Leon | ....................... | 430/270.1 |
| 6,455,224 B1 | * | 9/2002 | Oohashi et al. | .......... | 430/270.1 |
| 6,455,230 B1 | * | 9/2002 | Damme et al. | ............. | 430/302 |
| 6,461,792 B1 | * | 10/2002 | Kawakura et al. | ....... | 430/271.1 |
| 2001/0003643 A1 | * | 6/2001 | Kita et al. | ............... | 430/273.1 |
| 2001/0008740 A1 | * | 7/2001 | Kita | ....................... | 430/270.1 |
| 2001/0024766 A1 | * | 9/2001 | Kita et al. | ............... | 430/272.1 |
| 2001/0033992 A1 | * | 10/2001 | Kita | ....................... | 430/273.1 |

FOREIGN PATENT DOCUMENTS

| | | | | |
|---|---|---|---|---|
| EP | 816070 | * | 1/1998 | |
| EP | 1072402 | * | 1/2001 | ............. B41C/1/10 |
| EP | 1136256 | * | 9/2001 | ............. B41C/1/10 |
| JP | 2001-232966 | * | 8/2001 | ............. B41N/3/03 |

OTHER PUBLICATIONS

English machine translation of JP 2001–232966.*

* cited by examiner

Primary Examiner—Janet Baxter
Assistant Examiner—Amanda C. Walke
(74) Attorney, Agent, or Firm—Burns, Doane, Swecker & Mathis, LLP

(57) ABSTRACT

A negative-working heat-sensitive lithographic printing plate precursor, comprising a substrate having a water-receptive surface which has provided thereon sequentially:

(1) a thermal cross-linking layer comprising an aqueous alkali-soluble resin having aromatic hydroxyl groups, a cross-linking agent capable of cross-linking the resin by heating in the presence of an acid catalyst and an acid generator; and (2) a water-soluble overcoat layer;

wherein at least one layer of the overcoat layer and the thermal cross-linking layer comprise a compound capable of converting light into heat.

3 Claims, No Drawings

NEGATIVE-WORKING HEAT-SENSITIVE LITHOGRAPHIC PRINTING PLATE PRECURSOR

FIELD OF THE INVENTION

The present invention relates to a heat-sensitive lithographic printing plate precursor. More particularly, the present invention relates to a negative-working lithographic printing plate precursor wherein images can be recorded by exposure to infrared laser beams based on digital signals and the images recorded can be developed with an alkaline developer.

BACKGROUND OF THE INVENTION

Hitherto have been well-known negative-working heat-sensitive lithographic printing plate precursors having a structure that a thermal cross-linking layer is provided on a support. More specifically, negative images can be produced in those printing plate precursors by the following mechanism: The printing plate precursors evolve heat upon exposure to infrared laser beams, generate acids from acid generators contained therein by the action of the heat evolved, cause thermo cross-linking reaction in their thermal cross-linking layers by undergoing post-baking and utilizing the generated acids as catalyst, thereby rendering the cross-linking layers insoluble, and then dissolving and removing the areas unexposed to laser beams by development.

For instance, in JP-A-7-20629 and JP-A-7-271029 (the term "JP-A" as used herein means an "examined published Japanese patent application) are disclosed negative-working lithographic printing plate precursors having thermal cross-linking layers. These layers contain as main components an infrared absorbing dye capable of evolving heat by absorbing infrared radiation (compound capable of converting light into heat), a latent Brønsted acid or an s-triazine compound as acid generator, a resol resin as cross-linking agent and a novolak resin as both binder and polymer to be cross-linked.

Further, improvements in the sensitivity, the developability, the printing stain resistance and the post-baking stability of negative-working heat-sensitive lithographic printing plate precursors having the thermal cross-linking layers as mentioned above are disclosed in JP-A-10-111564, JP-A-11-84649, JP-A-11-95419, JP-A-11-119428 and JP-A-11-231509, WO 98/51544 and WO 98/31545.

However, the negative-working heat-sensitive lithographic printing plate precursors disclosed in the publications described above, which each have a thermal cross-linking layer on a support, produce a new problem that when the plate surface is touched with fingers the touched areas give an image formation failure in the shape of fingerprints. Accordingly, a special care is needed in handling those printing plate precursors. For instance, workers are required to handle the printing plate precursors with gloves on during the plate-making operations.

SUMMARY OF THE INVENTION

An object of the present invention is therefore to solve the aforementioned problem and, more specifically, to provide a negative-working heat-sensitive lithographic printing plate precursor which is easy to handle and causes no defects in images even when the plate surface is touched with fingers.

The present inventors have found that the foregoing problem can be solved by providing on a thermal cross-linking layer a water-soluble overcoat layer wherein at least one layer of the thermal cross-linking layer and a water-soluble overcoat layer contains a compound capable of converting light into heat, thereby achieving the present invention.

That is, the present invention comprises the following Embodiment (1):

(1) A negative-working heat-sensitive lithographic printing plate precursor comprising a substrate having a water-receptive surface: with the substrate having provided thereon sequentially 1) a thermal cross-linking layer comprising an aqueous alkali-soluble resin having aromatic hydroxyl groups, a cross-linking agent capable of cross-linking the resin by heating in the presence of an acid catalyst and an acid generator, and 2) a water-soluble overcoat layer; wherein the overcoat layer or both the overcoat layer and the thermal cross-linking layer comprise a compound capable of converting light into heat.

DETAILED DESCRIPTION OF THE INVENTION

Practical embodiments of the present invention are described below in detail.

The water-soluble overcoat layer used in the present invention can be removed easily under development, and comprises at least one resin selected from water-soluble organic or inorganic high molecular compounds. The water-soluble organic or inorganic high molecular compounds usable therein are compounds capable of forming films when coated and dried. Examples of such compounds include polyvinyl acetate (having a hydrolysis factor of at least 65%), polyacrylic acid and alkali metal or amine salts thereof polyacrylic acid copolymers and alkali metal or amine salts thereof, polymethacrylic acid and alkali metal or amine salts thereof, polymethacrylic acid copolymers and alkali metal or amine salts thereof, polyacrylamide and polyacrylamide copolymers, polyhydroxyethyl acrylate, polyvinyl pyrrolidone and polyvinyl pyrrolidone copolymers, polyvinyl methyl ether, polyvinyl methyl ether/maleic anhydride copolymer, poly-2-acrylamide-2-methyl-1-propanesulfonic acid and alkali metal or amine salts thereof, poly-2-acrylamide-2-methyl-1-propanesulfonic acid copolymers and alkali metal or amine salts thereof, gum arabic, cellulose derivatives (such as carboxymethyl cellulose, carboxyethyl cellulose and methyl cellulose) and modified products thereof, white dextrin, pullulan and enzyme-decomposed etherified dextrin. These resins may be used as a mixture of two or more thereof, if desired.

When the overcoat layer of the present invention is formed by coating an aqueous solution, nonionic surfactants can be added to the aqueous solution for the purpose of securing uniformity for the layer coated. Examples of nonionic surfactants usable for such a purpose include sorbitan tristearate, sorbitan monopalmitate, sorbitan trioleate, stearic acid monoglyceride, polyoxyethylene nonyl phenyl ether, and polyoxyethylene dodecyl ether.

The suitable proportion of such a nonionic surfactant to the total solid components in the overcoat layer is from 0.05 to 5 weight %, preferably from 1 to 3 weight %.

The suitable thickness of the overcoat layer provided in the present invention is from 0.05 to 4.0 $g/m^2$, preferably from 0.1 to 1.0 $g/m^2$. When the thickness is too thick, the developing capacity of a developer is lowered, and the overcoat layer remains after development to produce an adverse effect, e.g., no inking on image areas. When the thickness is too thin, on the other hand, the strength of the coating film becomes insufficient.

The aqueous alkali-soluble resin having aromatic hydroxyl groups which can be used in the present invention is at least one resin selected from novolak resins or polyvinyl phenol resins.

The novolak resins usable in the present invention include resins produced by polycondensation between at least one phenolic compound and at least one aldehyde or ketone in the presence of an acid catalyst. Examples of a phenolic compound which can participate in the polycondensation include phenol, o-cresol, m-cresol, p-cresol, 2,5-xylenol, 3,5-xylenol, o-ethylphenol, m-ethylphenol, p-ethylphenol, propylphenol, n-butylphenol, tert-butylphenol, 1-naphthol, 2-naphthol, resorcinol, 4,4 biphenyldiol, bisphenol-A and pyrogallol. Examples of an aldehyde which can participate in the polycondensation include formaldehyde, acetoaldehyde, propionaldehyde, benzaldehyde and furfural. Additionally, paraformaldehyde may be used instead of formaldehyde, and para-acetaldehyde may be used instead of acetaldehyde. Examples of a ketone which can participate in the polycondensation include acetone, methyl ethyl ketone and methyl isobutyl ketone. Of those novolak resins, products of polycondensation between phenols, including phenol, o-cresol, m-cresol, p-cresol, 2,5-xylenol, 3,5-xylenol and resorcinol, and aldehydes, including formaldehyde, acetaldehyde and propionaldehyde, are preferred. In particular, polycondensation products prepared from formaldehyde and mixed phenols, including m-cresol/p-cresol/2,5-xylenol/3,5-xylenol/resorcinol mixtures having mixing ratios of (70–100): (0–30): (0–20): (0–20): (0–20) by mole and phenol/m-cresol/p-cresol mixtures having mixing ratios of (10–100):(0–60):(0–40) by mole, are used to advantage.

The appropriate weight average molecular weight of the novolak resin as described above is from 1,000 to 15,000, particularly preferably from 1,500 to 10,000, in terms of a polystyrene determined by gel permeation chromatography.

Examples of the polyvinyl phenol resins usable in the present invention include resins produced by polymerizing one or more of hydroxystyrenes, such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl) propylene, in the presence of a radical or cationic polymerization initiator. Additionally, those hydroxystyrenes may have halogen atoms (such as chlorine, bromine, iodine and fluorine) or alkyl groups having 1 to 4 carbon atoms as substituents on their benzene rings. Of those resins, polymers of hydroxystyrenes having no substituents or alkyl groups having 1 to 4 carbon atoms on their benzene rings are preferred. In particular, the polymers of hydroxystyrenes having no substituents on their benzene rings are used to advantage.

Partial hydrogenation products of the polyvinyl phenol resins described above and the above-described polyvinyl phenol resins whose hydroxyl groups are partially protected with t-butoxycarbonyl, pyranyl or furyl groups may be used as the aqueous alkali-soluble resins of the present invention. The suitable weight average molecular weight of such polyvinyl phenol resins as described above is from 1,000 to 100,000, preferably from 1,500 to 50,000.

When the molecular weight of novolak or polyvinyl phenol resin used is below the range mentioned above, the film strength sufficient for printing images cannot be attained. On the other hand, when the novolak or polyvinyl phenol resin used has a molecular weight beyond the range described above, its solubility in an alkaline developer becomes low to result in insufficient clearing of unexposed areas, so that the printing plate obtained tends to generate stain.

The cross-linking agents usable in the present invention are compounds capable of cross-linking the novolak or polyvinyl phenol resins as described above and rendering them insoluble under the catalytic action of acids generated in the exposed areas of the thermal cross-linking layer. Therefore, the cross-linking agent used in the present invention has no other particular restrictions so far as it has an ability for cross-linking those resins. Typical examples thereof, as disclosed in JP-A-11-231509, include (a) aromatic compounds substituted with alkoxymethyl or hydroxymethyl groups, especially phenol compounds, (b) compounds containing N-hydroxymethyl, N-alkoxymethyl or N-acyloxymethyl groups and (c) epoxy compounds.

More specifically, the compounds suitable for the cross-linking agent of the present invention are 2,4,6-tris(ethoxymethyl)phenol, 4-chloro-2,6-bis(ethoxyethyl)phenol, 2,6-bis(hydroxymethyl)-p-toluene, 2,6-bis(ethoxymethyl)-p-toluene, 1-[α-methyl-α-(4—hydroxy-3,5-bis(hydroxymethyl)phenyl)ethyl]-4-[α,α-bis(4-hydroxy-3,5-bis(hydroxymethyl)phenyl)ethyl]benzene, melamine derivatives such as methoxymethylated melamine (Cymel 300 series, produced by Mitsui Cyanamide Co., Ltd.), benzoguanamine derivatives such as methyl/ethyl mixed alkoxylated benzoguanamine resins (Cymel 1100 series, produced by Mitsui Cyanamide Co., Ltd.), glycoluril derivatives such as tetramethylol glycoluril resins (Cymel 1100 series, produced by Mitsui Cyanamide Co., Ltd.), urea resin derivatives, and resol resins.

Of these compounds, the phenol compounds having alkoxymethyl or hydroxymethyl groups and melamine derivatives are preferred over the others.

Examples of the compounds suitable as acid generators used in the present invention include the onium salts disclosed in JP-A-7-20629, JP-A-11-119428 and JP-A-11-231509, compounds generating sulfonic acid by decomposition and trihaloalkyl compounds.

Examples of such onium salts include iodonium salts, sulfonium salts, phosphonium salts, selenonium salts, diazonium salts and arsonium salts. Examples of especially useful onium salts include diphenyliodonium hexafluorophosphate, triphenylsulfonium hexafluoroantimonate, phenylmethyl-ortholo-cyanobenzylsulfonium trifluoromethanesulfonate, 4-methoxybenzenediazonium-p-dodecylbenzenesulfonate, 4-phenylaminobenzenediazonium hexafluorophosphate, 4-phenylaminobenzenediazonium-p-dodecylbenzenesulfonate, 4-phenylaminobenzenediazonium mesitylenesulfonatie, 2-methoxy-4-phenylaminobenzenediazonium hexafluorophosphate, 2-methoxy-4-phenylaminobenzenediazonium mesitylenesulfonate, 2,4,6-triethoxybenzenecdiazonium mesitylenesulfonate, 2,4,6-triethoxybenzenediazonium—p-dodecylbenzenesulfonate and 2,4,6-trihexyloxybenzenediazonium mesitylenesulfonate.

Examples of the trihaloalkyl compounds suitably used as acid generators include the trihalomethyloxazole compounds and trihalomethyltriazine compounds disclosed in JP-A-53-36223, JP-A-54-74728, JP-A-60-3626, JP-A-61-143748, JP-A-61-151644 and JP-A-63-58440. Examples of such compounds include 2,4,6-tris(trichloromethyl)-s-triazine, 2-(4-methoxyphenyl)-4,6-bis(trichloromethyl)-s-triazine, 2-(4-N,N-bis(ethoxycarbonylmethyl) aminophenyl)-4,6-bis(tri-chloromethyl)-s-triazine, 2-(4-methoxystyryl)-4,6-bis(tri-chloromethyl)-s-triazine, 2-(4-methoxystyryl)-5-trichloro-methyl-1,3,4-oxadiazole, 2-(4-butoxystyryl)5-trichloro-methyl-1,3,4-oxadiazole and 2-(2-benzofuranylvinyl)-5-tri-chloromethyl-1,3,4-oxadiazole.

As to the proportion of each of the components constituting the thermal cross-linking layer of the present invention to the total solid components therein, the suitable proportion of an aqueous alkali-soluble resin having aromatic hydroxyl groups is from 10 to 95 weight %, preferably from 20 to 90 weight %, the suitable proportion of a cross-linking agent is from 10 to 75 weight %, preferably 10 to 50 weight %, and the suitable proportion of an acid generator is from 0.1 to 50 weight %, preferably 3 to 20 weight %.

The compound capable of converting light into heat added to at least one layer of the overcoat layer and the thermal cross-linking layer in the present invention may be any of materials capable of absorbing light of wavelengths of not shorter than 700 nm, and various pigments and dyes are included therein.

Specifically, pigments utilizable as the compound capable of converting light into heat include commercially available pigments and pigments described in Color Index (C.I.) Binran (Color Index (C.I.) Handbook), Saishin Ganryo Binran (Handbook of Latest Pigments), compiled by Nihon Ganryo Gijutsu Kyokai (1977), Saishin Ganryo Oyo Gijutsu (Latest Pigment Application Techniques), published by CMC Publishing Co., Ltd. (1986), and Insatsu Ink Gijutsu (Printing Ink Techniques), published by CMC Publishing Co., Ltd. (1984).

More specifically, various pigments, such as black pigments, brown pigments, red pigments, purple pigments, blue pigments, green pigments, fluorescent pigments, metallic powder pigments and polymer-attaching dyes, can be exemplified. Examples of such pigments include insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, cuinophthalone pigments, in-mold lake pigments, azine pigments, nitroso pigments, nitro pigments, natural pigments, fluorescent pigments, inorganic pigments and carbon black.

Those pigments may be used without surface treatment, or they may undergo surface treatment before use. Suitable examples of a method of treating the surface of pigment include a method of coating the pigment surface with a hydrophilic resin or an oleophilic resin, a method of adhering a surfactant to the pigment surface and a method of attaching a reactive substance (such as silica sol, alumina sol, silane coupling agents, epoxy compounds and isocyanate compounds) to the surface of the pigment. These surface treatment methods are described in Kinzoku Sekken no Seisitsu to Oyo (Properties and Applications of Metal Soap), Saiwai Shobo Co., Ltd., Insatsu Ink Gijutsu (Printing Ink Techniques), published by CMC Publishing Co., Ltd. (1984), and Saishin Ganryo Oyo Gijutsu (Latest Pigment Application Techniques), published by CMC Publishing Co., Ltd. (1986). Of the pigments described above, pigments capable of absorbing infrared radiation are preferred in particular since they can impart suitability for utilization of infrared laser to the printing plate precursor. As a pigment capable of absorbing infrared radiation, carbon black is used to greater advantage.

Examples of the pigments suitable in particular for being added to the overcoat layer of the present invention are hydrophilic resin-coated carbon black and silica sol-coated carbon black, because they are easily dispersed into water-soluble resins and have no adverse effect on water receptivity of the overcoat layer.

The suitable grain size of pigment is from 0.01 to 1 $\mu$m, preferably from 0.01 to 0.5 mm. As a method of dispersing pigments, well-known dispersion techniques for ink or toner production can be employed. Examples of a dispersing apparatus usable therein include an ultrasonic disperser, a sand mill, an attrition mill, a pearl mill, a super mill, a ball mill, an impeller, a disperser, a KD mill, a colloid mill, a dynatron, a three-roll mill and a pressure kneader. Details of dispersion techniques are described in Saishin Ganryo Oyo Gijutsu (Latest Pigment Application Techniques), published by CMC Publishing Co., Ltd. (1986).

Dyes usable as a compound capable of converting light into heat include commercially available dyes and well-known dyes as described, e.g., in Senryou Binran (Handbook of Dyes) compiled by Yuki Gosei Kagaku Kyokai (1970). As examples of such dyes, azo dyes, metal complex azo dyes, pyrazolone azo dyes, anthraquinone dyes, phthalocyanine dyes, carbonium dyes, quinoneimine dyes, methine dyes and cyanine dyes are exemplified. Of these dyes, infrared absorbing dyes are preferred in particular since they enable utilization of lasers emitting infrared radiation.

Examples of dyes capable of absorbing infrared radiation include the cyanine dyes as disclosed in JP-A-58-125246, JP-A-59-84356 and JP-A-60-78787, the methine dyes as disclosed in JP-A-58-173696, JP-A-58-181690 and JP-A-58-194595, the naphthoquinone dyes as disclosed in JP-A-58-112793, JP-A-58-224793, JP-A-59-48187, JP-A-59-73996, JP-A-60-52940 and JP-A-60-63744, the squarylium dyes as disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512.

In addition, sensitizers capable of absorbing the near infrared radiation disclosed in U.S. Pat. No. 5,156,938 can be suitably used as dyes. Besides the dyes described above, the substituted arylbenzo(thio)pyrylium salts disclosed in U.S. Pat. No. 3,881,924, the trimethinethiapyrylium salts disclosed in JP-A-57-142645 (corresponding to U.S. Pat. No. 4,327,169), the pyrylium compounds disclosed in JP-A-58-181051, JP-A-58-220143, JP-A-59-41363, JP-A-59-84248, JP-A-59-84249, JP-A-59-146063 and JP-A-59-146061, the cyanine dyes disclosed in JP-A-59-216146, the pentamethinethiopyrylium salts disclosed in U.S. Pat. No. 4,283,475, the pyrylium compounds disclosed in JP-B-5-13514 and JP-B-5-19702 (the term "JP-B" as used herein means an "examined Japanese patent publication", and EPOLIGHT III-178, EPOLIGHT III-130 and EPOLIGHT III-125 (produced by Epolin Co., Ltd.) can be favorably used.

Of the dyes described above, the dyes particularly suitable for the addition to the overcoat layer are water-soluble dyes, and examples thereof are illustrated below by their respective structural formulae.

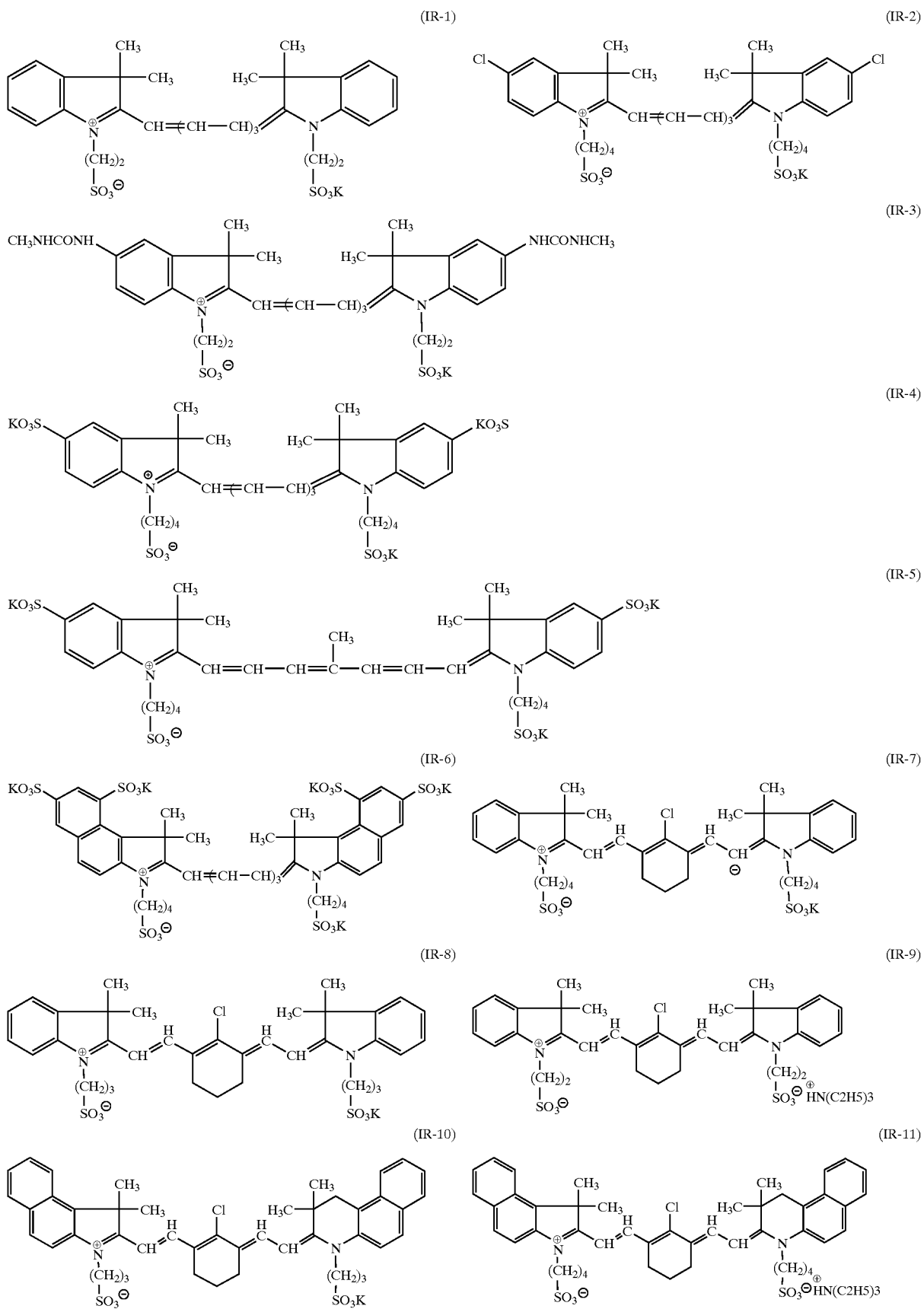

The dyes used in the thermal cross-linking layer of the present invention may be dyes capable of absorbing infrared radiation as described above, but more suitable dyes therefor are more oleophilic dyes. As examples of dyes preferred in particular, the following cyanine dyes can be exemplified.

when the compound capable of converting light into heat added is a pigment.

The addition of a compound capable of converting light into heat in a proportion below the aforementioned range brings about low sensitivity, while the addition in a propor-

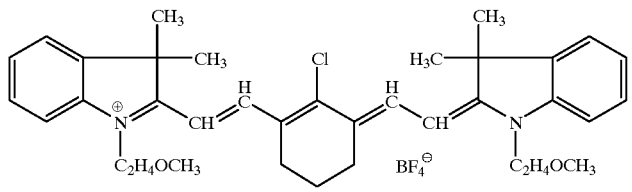
(IR-21)

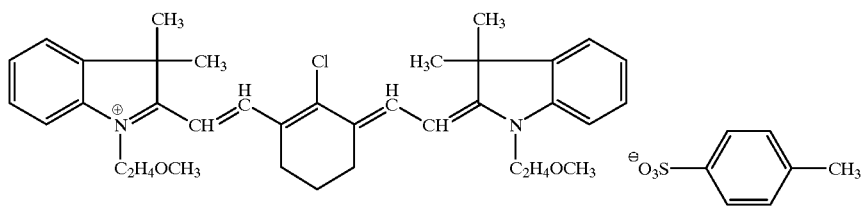
(IR-22)

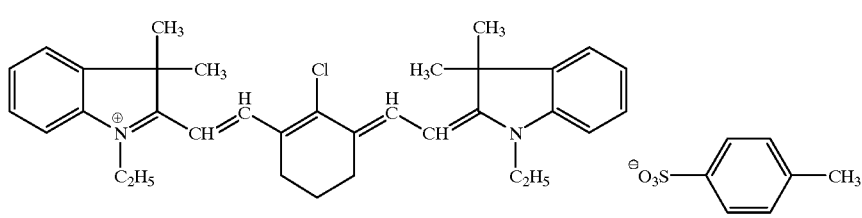
(IR-23)

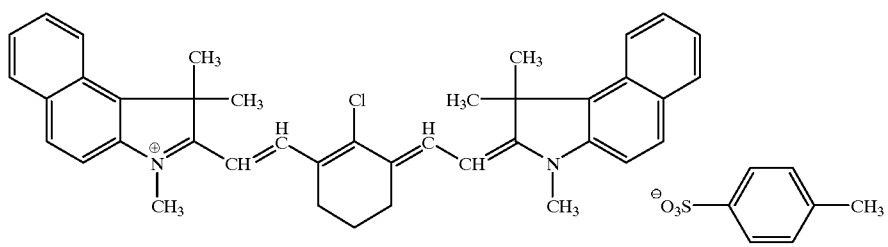
(IR-24)

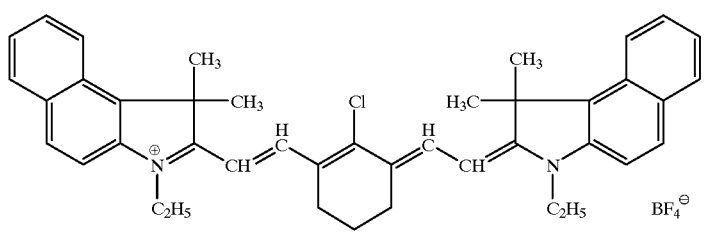
(IR-25)

The compound capable of converting light into heat is added to the overcoat layer in a proportion of 1 to 70 weight %, preferably from 2 to 50 weight %, to the total solid components therein. In particular, the proportion ranging from 2 to 30 weight % is effective when the compound capable of converting light into heat added is a dye, while the proportion ranging from 20 to 50 weight % is effective tion beyond the aforementioned range causes the overcoat layer to lose its uniformity and undergo deterioration in film strength.

When the compound capable of converting light into heat is added to the thermal cross-linking layer, the proportion thereof to the total solid components in the layer is 50 weight % or less, preferably 20 weight % or less. The addition of the compound capable of converting light into heat in a proportion beyond the foregoing upper limit causes generation of stain in the non-image areas at the time of printing. The amount of compound capable of converting light into heat added to the thermal cross-linking layer can be reduced depending on the amount in which the compound capable of converting light into heat is added to the overcoat layer, or the thermal cross-linking layer may be free of compound capable of converting light into heat.

In addition to the components described above, the thermal cross-linking layer of the present invention can contain additives generally used for lithographic printing plate precursors, such as a development accelerator, dyes and pigments for coloring images, agents for improving coating properties, an adhesion enhancing agent and an ink-receptivity agent.

The thermal cross-linking layer of the present invention can be formed by coating on a substrate surface a solution prepared by dissolving the components as described above in an appropriate solvent, heating the coating and then drying it. The solvent used herein has no particular restriction so far as the components used can have sufficient solubilities therein and it can impart satisfactory film properties to the coating. Examples of a solvent usable therein include cellosolve solvents, such as methyl cellosolve, ethyl cellosolve, methyl cellosolve acetate and ethyl cellosolve acetate; propylene glycol solvents, such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate and dipropylene glycol dimethyl ether; ester solvents, such as butyl acetate, amyl acetate, ethyl butyrate, butyl butyrate, diethyl oxalate, ethyl pyruvate, ethyl 2-hydroxybutyrate, ethyl acetoacetate, methyl lactate, ethyl lactate and methyl 3-methoxypropionate; alcohol solvents, such as heptanol, hexanol, diacetone alcohol and furfuryl alcohol; ketone solvents, such as cyclohexanone and methyl amyl ketone; highly polar solvents, such as dimethylformamide, dimethylacetamide and N-methylpyrrolidone; mixtures of two or more of the solvents described above; and the above-described solvents to which aromatic hydrocarbons are added. The solvent is generally used in an amount that is about one to about 20 times the weight of total solid components in the image-forming layer.

In coating the solution for the thermal cross-linking layer of the present invention can be adopted well-known methods, such as spin coating, wire-bar coating, dip coating, air knife coating, roll coating, blade coating and curtain coating. The suitable coverage, though depends on the intended purpose, can be generally varied within the range of 0.1 to 10 $g/m^2$, preferably 0.5 to 2.5 $g/m^2$.

As the substrate having a water-receptive surface, an aluminum sheet (including an aluminum plate) can be suitably used in the present invention. Examples of such an aluminum sheet includes a pure aluminum sheet, an aluminum alloy sheet containing trace amounts of foreign metals and a thin plastic film-laminated aluminum or aluminum alloy sheet. Examples of foreign metals contained in the aluminum alloy include silicon, iron, manganese, copper, magnesium, chromium, zinc, bismuth, nickel and titanium. The content of those foreign metals in the alloy is about 10 weight % or less. However, the aluminum sheet used in the present invention may be chosen properly from aluminum sheets made of hitherto well-known and widely used materials.

The thickness of the foregoing substrate used in the present invention is from 0.05 to 0.6 mm, preferably from 0.1 to 0.4 mm, particularly preferably from 0.15 to 0.3 mm.

Prior to the use of an aluminum sheet, it is advantageous that the aluminum sheet be subjected to surface treatment, such as graining and anodic oxidation. By conducting the surface treatment, the aluminum sheet can have improved water receptivity and increased adhesion to the thermal cross-linking layer.

The graining treatment for an aluminum sheet can be carried out using various methods, e.g., a mechanical graining method, a method of graining the aluminum sheet surface by electrochemical dissolution and a method of chemically causing selective dissolution of the aluminum sheet surface. Examples of a mechanical method usable therein include well-known abrasion methods, such as a ball abrasion method, a brush abrasion method, a blast abrasion method and a buff abrasion method. As the chemical graining method, the method disclosed in JP-A-54-31187 can be used to advantage, wherein an aluminum sheet is immersed in a saturated water solution of aluminum salt of mineral acid. As an example of electrochemical graining methods, there is known the method of performing electrochemical graining in an electrolytic solution containing an acid, such as hydrochloric acid or nitric acid by application of AC or DC thereto. As the other example thereof, the method disclosed in JP-A-54-63902 can be used, wherein mixed acids are used for electrolytic solution.

It is preferable that the graining treatment using any of the aforementioned methods be carried out so that the aluminum sheet surface has a center line average surface roughness (Ra) of 0.2 to 1.0 μm.

The thus grained aluminum sheet is subjected to alkali etching with a water solution of potassium hydroxide or sodium hydroxide, if needed, and further to neutralization treatment. Thereafter, the aluminum sheet undergoes anodic oxidation for enhancing abrasion resistance, if desired.

Electrolytes usable for anodic oxidation of aluminum plates include various kinds of electrolytes enabling the formation of porous oxide film. In general, sulfuric acid, hydrochloric acid, oxalic acid, chromic acid and mixtures of two or more thereof can be used as those electrolytes. The suitable electrolyte concentration can be determined properly depending on the kind of the electrolyte used.

The treatment conditions for anodic oxidation vary among electrolytes, so they cannot be specified sweepingly. However, appropriate conditions are generally within the following ranges: the electrolyte concentration ranges from 1 to 80 weight %, the electrolytic solution temperature ranges from 5 to 70° C., the current density ranges from 5 to 60 $A/dm^2$, the voltage ranges from 1 to 100 V, and the electrolysis time renges from 10 seconds to 5 minutes.

The appropriate amount of oxide film formed is from 1.0 to 5.0 $g/m^2$, preferably from 1.5 to 4.0 $g/m^2$.

As the substrate having a water-receptive surface of the present invention, the substrate whose surface is covered with an oxide film by having undergone the foregoing surface treatment can be used as it is. Also, it is advantageous to use such a substrate after subjecting it to treatment for further enhancing the water-receptivity, stain resistance and adhesion to the thermal cross-linking layer. Examples of such treatment include treatment with boiling water or steam, immersion treatment in an aqueous solution of alkali silicate, such as sodium silicate, and treatment for forming an undercoating layer. Such a undercoating layer can be formed by applying to the substrate having a oxide film a solution containing polyvinylphosphonic acid, polyacrylic acid, a polymer or copolymer having sulfonic acid groups in their side chains, or the compound disclosed in JP-A-11-

231509 including the organic compounds containing both (a) amino group and (b) phosphine, phosphone or phosphoric acid group and the salts thereof.

In the heat-sensitive lithographic printing plate precursor of the present invention, images are formed by the action of heat. Specifically, direct image-drawing recording with a thermal recording head, scanning exposure with infrared laser, high-illumination flash exposure using, e.g., a xenon discharge lamp and exposure with an infrared lamp can be utilized for image formation. In particular, exposure with semiconductor laser emitting infrared radiation of wavelengths ranging from 700 to 1,200 nm and exposure with high-output solid-state infrared laser, such as YAG laser, are preferably used.

After scanning exposure with laser as a light source, the printing plate precursor of the present invention is preferably subjected to post-baking treatment. Then, the overcoat layer and the non-image areas of the thermal cross-linking layer are dissolved and removed with a developer. Thus, a printing plate is made. The post-baking temperature which can be adopted is generally from 50 to 200° C., preferably 90 to 160° C.

The developer usable for the lithographic printing plate precursor of the present invention is an aqueous solution containing an alkali agent. Suitable examples of such an alkali agent include sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogen carbonate, potassium hydrogen carbonate, sodium carbonate, potassium carbonate, ammonia, monomethanolamine, diethanolamine, triethanolamine, dipropanolamine and tripropanolamine. The alkali agent as described above is added so that the resultant alkaline aqueous solution has a concentration of 0.1 to 10 weight %, preferably 0.5 to 5 weight %.

To the developer used in the present invention, an organic solvent, such as benzyl alcohol, 2-phenoxyethanol or 2-butoxyethanol, can be added, if needed. Further, the developer can contain as a surfactant an anionic, nonionic or amphoteric surfactant.

In addition, the developer used in the present invention can contain well-known additives, such as a storage stabilizer such as sodium sulfite, a chelating agent such as EDTA, a coloring agent and a defoaming agent.

EXAMPLES

The present invention will now be illustrated in more detail by reference to the following examples, but these examples should not be construed as limiting the scope of the present invention in any way.

In the following examples and comparative examples, the aluminum substrate prepared in the following manner was used in common.

The surface of a 0.24 mm-thick aluminum sheet (material quality:1050) was grained using a nylon brush and a 400-mesh pumice-water suspension, and washed thoroughly with water. This sheet was etched by immersion in a 15% aqueous solution of sodium hydroxide, washed with water, and further neutralized with 1% $HNO_3$. Then, the thus etched sheet underwent electrolytic surface-roughening treatment wherein a 0.7% aqueous solution of nitric acid was used as an electrolytic solution and an alternating current of rectangular form was applied so that the quantity of electricity at the anode was 160 Coulomb/$dm^2$. After washing with water, the aluminum sheet was etched again by immersion in a 10% aqueous solution of sodium hydroxide, and further washed with water. Then, the aluminum sheet was desmutted by immersion in a 30% aqueous solution of $H_2SO_4$, and washed with water. Further, the resulting aluminum sheet was subjected to anodization in a 20% aqueous solution of $H_2SO_4$ by application of direct current thereto till the coverage of the oxide film was 2.7 g/$m^2$.

Furthermore, on the thus treated aluminum plate, a solution constituted of 0.10 g of 2-aminoethylphosphonic acid, 50 g of purified water and 50 g of methanol was coated, and dried at 80° C. for 30 seconds to form a undercoating layer having a dry coverage of 20 mg/$M^2$.

EXAMPLE 1

[Preparation of Heat-Sensitive Lithographic Printing Plate Precursor]

On the aluminum substrate prepared in the foregoing manner, the following Coating Solution I for thermal cross-linking layer was coated so as to have a dry coverage of 1.5 g/$m^2$.

(Coating Solution I for Thermal Cross-Linking Layer)

| | |
|---|---|
| Poly(p-hydroxystyrene), MARUKALINKER MS-4P (trade name, produced by Maruzen Petro-Chemical, Co., Ltd.) | 1.5 g |
| Cross-linking agent (*1) | 0.5 g |
| Acid generator (*2) | 0.3 g |
| EISENSPIRON BLUE C-RH (trade name, produced by Hodogaya Chemical, Co., Ltd.) | 0.35 g |
| Fluorine-containing surfactant, MEGAFAC F-177 (trade name, produced by Dai-Nippon Ink & Chemicals, Ink) | 0.01 g |
| Phthalic acid acid anhydride | 0.05 g |
| Methyl ethyl ketone | 12 g |
| Methyl alcohol | 10 g |
| 1-Methoxy-2-propanol | 8 g |

(*1) 1-[α-Methyl-α-(4-hydroxy-3,5-bis(hydroxymethyl)-phenyl)ethyl]-4-[α,α-bis(4-hydroxy-3,5-bis(hydroxymethyl)phenyl)ethyl]benzene
(*2) 2,4,6-Triethoxybenzenediazonium mesitylenesulfonate On the thus formed thermal cross-linking layer, the following Coating Solution A for overcoat layer was coated at a dry coverage of 0.6 g/$m^2_1$ thereby preparing a heat-sensitive lithographic printing plate precursor.
(Coating Solution A for Overcoat Layer)

| | |
|---|---|
| Polyacrylic acid (weight average molecular weight: 25,000) | 1 g |
| Water-soluble Dye (IR-11) illustrated in this specification) | 0.2 g |
| Polyoxyethylene nonyl phenyl ether | 0.025 g |
| Water | 19 g |

[Exposure, Development and Printing]

The lithographic printing plate precursor thus prepared was exposed by means of a plate setter equipped with a 830-nm semiconductor laser device of 40 watts, TREND SETTER (trade name, made by CREO CO., Ltd., Canada), and further heated at 110° C. for 30 seconds. Then, the resulting printing plate precursor was developed with an aqueous solution containing a silicate, specifically a 1:8 water-diluted solution of Developer DP-4 (a product of Fuji Photo Film Co., Ltd.).

The thus made printing plate was mounted in a printing machine (i.e., a printing press), Model KOR-D (made by Heidelberg Corp.), and subjected to printing operations by the use of a fountain solution and printing ink. The fountain solution used therein was a 10 volume % aqueous isopropanol solution containing a plate etch. As a result, 100,000 sheets of good-quality printed matter were obtained without attended by image defects in the shape of fingerprints even when the printing plate precursor was handled with ungloved hands during the plate-making operations and the surface thereof was touched with naked fingers.

COMPARATIVE EXAMPLE 1

To the Coating Solution I used for forming the thermal cross-linking layer in Example 1 was added 0.07 g of Dye (IR-24) illustrated in this specification. The resulting solution was coated on the same undercoating layer-provided aluminum substrate as used in Example 1 so as to have a dry coverage of 1.5 g/m$^2$ as in the case of Example 1, but on the coating formed no overcoat layer was provided. The thus prepared lithographic printing plate precursor was adopted as a printing plate precursor for comparison.

The printing plate precursor for comparison was subjected to the same exposure, post-baking, development and printing operations as in Example 1. As a result, image formation failures in the shape of fingerprints were found in the spots on the plate surface where fingers touched during the plate-making operations.

EXAMPLES 2 TO 5

Heat-sensitive lithographic printing plate precursors were prepared in the same manner as in Example 1, except that the Coating Composition A for overcoat layer was replaced by the following Coating Compositions B respectively.
(Coating Composition B for Overcoat Layer)

| | |
|---|---|
| Water-soluble polymer described below | 1 g |
| Water-soluble Dye (IR-11) illustrated in this specification | 0.2 g |
| Polyoxyethylene nonyl phenyl ether | 0.025 g |
| Water | 19 g |

As the above water-soluble polymer, sodium polymethacrylate (weight average molecular weight: 15,000) was used in Example 2, polyvinyl alcohol (saponification degree: 88%, polymerization degree: 1,000) in Example 3, polyacrylamide (weight average molecular weight: 10,000) in Example 4, and a 8:2 by weight mixture of polyvinyl alcohol (saponification degree: 88%, polymerization degree: 1,000) and polyacrylic acid (weight average molecular weight: 25,000) in Example 5.

The thus prepared printing plate precursors were each subjected to the same exposure, post-baking, development and printing operations as in Example 1. As a result, all the printing plates thus made were found to provide good-quality printed matter free of image defects in the shape of fingerprints.

EXAMPLES 6 TO 9

Heat-sensitive lithographic printing plate precursors were prepared in the same manner as in Example 1, except that the water-soluble Dye (IR-11) used in the overcoat layer was replaced by Dye (IR-1) in Example 6, Dye (IR-9) in Example 7, Dye (IR-10) in Example 8 and Dye (IR-7) in Example 9, respectively.

The thus prepared printing plate precursors were each subjected to the same exposure, post-baking, development and printing operations as in Example 1. As a result, all the printing plates thus made were found to provide good-quality printed matter free of image defects in the shape of fingerprints.

EXAMPLE 10

On the same surface-treated aluminum substrate as used in Example 1, the following Coating Solution II for thermal cross-linking layer was coated so as to have a dry coverage of 1.5 g/m$^2$.
(Coating Solution II for Thermal Cross-linking Layer)

| | |
|---|---|
| Novolak resin (*3) | 5 g |
| Methoxymethylated melamine (*4) | 1 g |
| 2,4-Bis(trichloromethyl)-6-p-methoxystyryl-s-triazine | 0.25 g |
| Dye (IR-24) illustrated in this specification | 0.25 g |
| VICTORIA PURE BLUE BOH (trade name, produced by Hodogaya Chemical, Co., Ltd.) | 0.05 g |
| Phthalic acid anhydride | 0.05 g |
| 1-Methoxy-2-propanol | 40 g |
| Methyl ethyl ketone | 50 g |
| Cyclohexanone | 20 g |

(*3) Resin prepared by polycondensation reaction between formaldehyde and a 5:3:2 mixture of phenol, m-cresol and p-cresol (weight average molecular weight: 7,000)
(*4) CYAMEL 300 (trade name, produced by Mitsui Cyanamide Co., Ltd.)

On the thus formed thermal cross-linking layer, the following Coating Solution C for overcoat layer was coated at a dry coverage of 0.5 g/m$^2$, thereby preparing a heat-sensitive lithographic printing plate precursor.
(Coating Solution C for Overcoat Layer)

| | |
|---|---|
| Polyacrylic acid (weight average molecular weight; 25,000) | 1 g |
| Polyoxyethylene nonyl phenyl ether | 0.025 g |
| Water | 19 g |

The thus prepared printing plate precursor was exposed in the same manner as in Example 1, and then the surface thereof was forcibly toughed with fingers. Thereafter, the printing plate precursor was heated at 140° C. for 60 seconds, and subjected to the same development as in Example 1. The same printing operations as in Example 1 were carried out using the thus made printing plate. As a result, good-quality prints free of image defects in the shape of fingerprints were obtained.

Additionally, the printing plate precursor obtained without coating the foregoing thermal cross-linking layer with the foregoing overcoat layer was processed in the manner as described above to make a printing plate. The printing plate thus made caused an image formation failure in the shape of fingerprints in the spots where the fingers had touched when underwent printing operations.

EXAMPLE 11

On the same surface-treated aluminum substrate as used in Example 1, the following Coating Solution III for thermal cross-linking layer was coated in the same manner as in Example 1.

(Coating Solution III for Thermal Cross-linking Layer)

| | |
|---|---:|
| Acid generator (the same as in Example 1) | 0.3 g |
| Cross-linking agent (the same as in Example 1) | 0.5 g |
| Poly(p-hydroxystyrene) (the same as in Example 1) | 1.5 g |
| Dye (IR-21) illustrated in this specification | 0.03 g |
| Eisenspiron Blue C-RH | 0.035 g |
| Fluorine-containing surfactant, Megafac F-177 | 0.01 g |
| Phthalic anhydride | 0.05 g |
| Methyl ethyl ketone | 12 g |
| Methyl alcohol | 10 g |
| 1-Methoxy-2-propanol | 8 g |

On the thermal cross-linking layer-provided substrate, the same overcoat layer as in Example 1 was coated so as to have a dry coverage of 0.5 g/m², thereby preparing a heat-sensitive lithographic printing plate precursor.

The thus prepared printing plate precursor was subjected to the same exposure, post-baking, development and printing operations as in Example 1. As a result, the printing plate thus made was found to provide good-quality printed matter free of image defects in the shape of fingerprints.

EFFECT OF THE INVENTION

In accordance with the present invention, the problem of an image formation failure caused by touching the plate surface with fingers in the course of plate-making can be solved, and thereby negative-working heat-sensitive lithographic printing plate precursors which are easy to handle can be provided.

While the invention has been described in detail and with reference to specific embodiments thereof, it will be apparent to one skilled in the art that various changes and modifications can be made therein without departing from the spirit and scope thereof.

What is claimed is:

1. A negative-working heat-sensitive lithographic printing plate precursor, comprising a substrate having a water-receptive surface which has provided thereon sequentially:

(1) a thermal cross-linking layer comprising an aqueous alkali-soluble resin having aromatic hydroxyl groups, a cross-linking agent capable of cross-linking the resin by heating in the presence of an acid catalyst, and an acid generator; and (2) a water-soluble overcoat layer; wherein the compound capable of converting light into heat is contained in the overcoat layer in a proportion of from 1 to 70 weight % to the total solid components of the overcoat layer.

2. The negative-working heat-sensitive lithographic printing plate precursor as in claim 1, wherein the aqueous alkali-soluble resin is contained in a proportion of from 10 to 95 weight %, the cross-linking agent is contained in a proportion of from 10 to 75 weight %, and the acid generator is obtained in a proportion of 0.1 to 50 weight %, the total solid components of the thermal cross-linking layer.

3. The negative-working heat-sensitive lithographic printing plate precursor as in claim 1, wherein the compound capable of converting light into heat is further contained in the cross-linking layer in a proportion of 50 weight % or less to the total solid components of the cross-linking layer.

* * * * *